(12) United States Patent
Koizumi et al.

(10) Patent No.: US 8,393,460 B2
(45) Date of Patent: Mar. 12, 2013

(54) VACUUM APPARATUS AND METHOD FOR CONVEYING SUBSTRATE

(75) Inventors: Toshiyuki Koizumi, Chigasaki (JP); Kouichi Niikura, Chigasaki (JP)

(73) Assignee: ULVAC, Inc, Chigasaki-shi (JP)

( * ) Notice: Subject to any disclaimer, the term of this patent is extended or adjusted under 35 U.S.C. 154(b) by 594 days.

(21) Appl. No.: 12/585,096

(22) Filed: Sep. 3, 2009

(65) Prior Publication Data

US 2010/0006397 A1    Jan. 14, 2010

Related U.S. Application Data

(63) Continuation-in-part of application No. PCT/JP2008/052823, filed on Feb. 20, 2008.

(30) Foreign Application Priority Data

Mar. 7, 2007   (JP) ................................ 2007-056629

(51) Int. Cl.
    *B65G 47/00*   (2006.01)
(52) U.S. Cl. ........................................ 198/617; 198/780
(58) Field of Classification Search .................. 198/624, 198/780, 836.1
    See application file for complete search history.

(56) References Cited

U.S. PATENT DOCUMENTS

| | | | | |
|---|---|---|---|---|
| 3,666,084 A * | 5/1972 | Stehl | ............................. | 198/866 |
| 4,042,128 A * | 8/1977 | Shrader | ......................... | 414/287 |
| 4,650,064 A * | 3/1987 | Slabaugh | .................... | 198/631.1 |
| 4,716,686 A * | 1/1988 | Lisec | ............................. | 451/184 |
| 4,765,273 A | 8/1988 | Anderle | ......................... | 118/729 |
| 4,911,779 A * | 3/1990 | Lenhardt | ....................... | 156/556 |
| 7,572,339 B2 * | 8/2009 | Cho et al. | ....................... | 118/729 |
| 7,678,198 B2 * | 3/2010 | Hartig | ............................ | 118/729 |
| 8,020,692 B2 * | 9/2011 | Jung et al. | ..................... | 198/624 |
| 2005/0199493 A1 | 9/2005 | Bangert et al. | ........... | 204/298.23 |
| 2010/0329828 A1* | 12/2010 | Kisimoto et al. | ............. | 414/217 |

FOREIGN PATENT DOCUMENTS

| | | |
|---|---|---|
| CN | 1309073 A | 8/2001 |
| JP | 63-101240 | 5/1988 |
| JP | 10-265018 | 10/1998 |
| JP | 2001213517 A * | 8/2001 |
| JP | 2004-281617 | 10/2004 |
| JP | 2006-008396 | 1/2006 |
| JP | 2006-513117 | 4/2006 |

OTHER PUBLICATIONS

English translation of Chinese Office Action issued in counterpart application No. 2008880007493.4 mailed Apr. 26, 2011 (4 pages).
International Search Report dated Mar. 18, 2008.

\* cited by examiner

*Primary Examiner* — Gene Crawford
*Assistant Examiner* — William R Harp
(74) *Attorney, Agent, or Firm* — Kratz, Quintos & Hanson, LLP

(57) ABSTRACT

A vacuum apparatus, which conveys a large-sized substrate and saves space, is provided. The vacuum apparatus of the present invention comprises pluralities of lower rollers, pressing rollers and pressing mechanisms. Since the substrate is sandwiched by the lower rollers and the pressing rollers at a position between the conveying roller and the conveying roller, the substrate does not fall down. The substrate contacts the pressing rollers and pushes the pressing roller back, and is sandwiched between the pressing roller and the lower roller, so that the substrate is not damaged when sandwiched.

1 Claim, 9 Drawing Sheets

VACUUM APPARATUS AND METHOD FOR CONVEYING SUBSTRATE

This is a Continuation-in-Part of International Application No. PCT/JP2008/052823 filed on Feb. 20, 2008, which claims priority of Japan Patent Document No. 2007-056629 filed on Mar. 7, 2007. The entire disclosure of the prior application is incorporated by reference herein in its entirety.

BACKGROUND

The present invention generally relates to a technical field of a vacuum apparatus; and more particularly, to a vacuum apparatus having a device for conveying a substrate, while standing it at a nearly vertical angle.

Conventionally, a substrate in a horizontal posture is placed on a hand of a substrate conveying robot; and the substrate is conveyed still in the horizontal posture by expanding and shrinking the hand. Alternatively, a substrate in a horizontal posture is placed on a plurality of rollers having rotary axes horizontally arranged to convey it by rotating the rollers, while the horizontal posture is being maintained.

However, in such vacuum apparatuses, as substrates become larger, the required installation area also becomes larger.

Under these circumstances, a vacuum apparatus, which conveys a substrate without being set in a horizontal posture, has recently been proposed. For example, techniques are proposed, in which a substrate fitted into a frame is conveyed in a vertical posture, or conveying rollers are arranged in a line on a bottom wall of a vacuum chamber, and a substrate is placed on the conveying rollers standing to be conveyed in an approximately vertical posture by rotating the conveying rollers.

However, when the substrate is conveyed in the vertical posture, it is feared that the substrate falls down from the conveying rollers. In order to prevent the falling down of the substrate, it is suggested that recessed grooves are provided at peripheral faces of the conveying rollers. When the recessed grooves are provided, however, there is a possibility that the substrate may bump against a wall of the recessed groove during the conveyance, thereby resulting in the substrate being damaged.

See, Japanese Patent Document JP-A 10-265018.

SUMMARY OF THE INVENTION

The present invention, which has been made to solve the above problems, is aimed at providing a conveying apparatus capable of conveying a substrate in an approximately vertical posture.

Specifically, the invention is aimed at providing a conveying apparatus capable of conveying a large-sized and thin substrate in an approximately vertical posture without breaking the substrate during the conveyance.

In order to solve the above problems, the present invention is directed to a vacuum apparatus comprising a vacuum chamber, a plurality of conveying rollers located on a side of a bottom wall inside the vacuum chamber and arranged along a direction in which a single conveying straight line extends, a plurality of upper rollers located on a side of a ceiling of the vacuum chamber and arranged along the direction in which the conveying straight line extends, and rotating devices for rotating the conveying rollers around rotary axes, respectively. The conveying rollers are arranged such that the rotary axes are in parallel to each other and peripheral faces contact with a line identical to the conveying straight line. When the substrate is placed on the peripheral faces of the conveying rollers in a conveying posture in which the substrate is directed to a direction along the conveying straight line in the state of being inclined at a predetermined inclination angle from a vertical axis; and the upper rollers are arranged at positions in which their peripheral faces contact the lower one of the surfaces of the substrate which is directed downwardly. When the conveying rollers rotate and the substrate on the conveying rollers moves in the direction along the conveying straight line while maintaining the conveying posture, the upper rollers rotate while contacting an upper portion of the lower surface of the substrate. The vacuum apparatus further includes a plurality of lower rollers, a plurality of pressing rollers and pressing mechanisms consisting of springs, wherein the positions of rotary axes of the lower rollers are immobilized relative to the vacuum chamber; the pressing rollers are pressed to the lower rollers by the pressing mechanism such that the pressing rollers can be pushed back. The lower rollers are disposed at positions in which peripheral faces are capable of contacting a lower portion of the lower surface of the substrate in the conveying posture on the conveying rollers. When the substrate moves in the conveying posture on the conveying rollers, the substrate is inserted between the lower rollers and the pressing rollers by pushing the pressing rollers back; and the substrate moves, while the lower rollers and the pressing rollers are being rotated, in a state such that the substrate is sandwiched by the lower rollers and the pressing rollers.

The present invention is directed to a vacuum apparatus, wherein the rotary axes of the conveying rollers are inclined at a predetermined angle from a horizontal plane. The peripheral faces of the lower rollers and the peripheral faces of the upper rollers are arranged in positions in which the peripheral faces contact a single flat plane containing the conveying straight line and inclined at the inclined angle.

The present invention is also directed to the vacuum apparatus, wherein the upper rollers and the conveying rollers are such that the rotary axes of the upper rollers are inclined at the inclination angle from the vertical axis; and the rotary axes of the conveying rollers are inclined at the inclination angle from the horizontal plane.

The present invention is directed to the vacuum apparatus, further comprising a heater for heating the substrate being provided at a position opposed to the lower surface of the substrate on the conveying rollers.

The present invention is also directed to a vacuum apparatus, wherein a target is arranged at a position opposed to the upper surface of the substrate on the conveying rollers which is directed upwardly.

The present invention is also directed to a vacuum apparatus, wherein a sputtering gas feeding system is connected to the vacuum chamber, and a sputtering power source is connected to the target.

Moreover, the present invention is a method for conveying a substrate, comprising the steps of: arranging a plurality of conveying rollers, which have rotary axes inclined at a predetermined angle from a horizontal plane, along a direction in which a single conveying straight line extends; arranging a plurality of upper rollers at positions above the conveying rollers; arranging the substrate in a conveying posture in which the substrate is inclined at a predetermined inclination angle from a vertical direction in the state of one side of a lower end of the substrate contacting with peripheral faces of at least two conveying rollers; contacting an upper portion of the lower surface directed downwardly of the substrate in the conveying posture with peripheral faces of the upper rollers; conveying the substrate in the conveying posture, while the conveying rollers and the upper rollers are rotating; arranging a plurality of lower rollers, along the direction in which the conveying straight line extends, at positions in which they can contact a lower portion of the lower surface of the substrate in the conveying posture on the conveying rollers; arranging the pressing rollers, with urging forces applied in a direction of the lower rollers, in such positions that the pressing rollers can contact the lower portion of the upper surface of the substrate directed upwardly; heating the lower surface of the substrate at a higher temperature than the upper surface of the substrate, so that the lower surface is made convex and the surface on the opposite side is made concave; contacting the lower portion of the substrate moving on the conveying rollers with the pressing rollers; pressing the lower portion of the upper surface of the substrate with the pressing rollers in directions of the lower rollers when the substrate enters between the lower roller and the pressing roller; and moving the substrate, in such a state that the lower end of the substrate is sandwiched by the lower rollers and the pressing rollers.

Since the present invention is constructed as discussed above and the substrate cannot be placed if the rotary axes of the conveying rollers are vertical, the angle formed between the rotary shaft and the horizontal plane is at least 0 degree and at most 90 degrees at a maximum. The angle between the rotary axis of the conveying roller and the horizontal plane can be set to the same as the inclination angle θ (an angle of 2° to 5° as one example) of the substrate.

When the substrate on the conveying rollers is not in contact with the peripheral faces of the lower rollers, the peripheral faces of the lower rollers are in contact with the peripheral faces of the pressing rollers. From that state, as the substrate inclined at the inclination angle approaches the conveying rollers and the lower surface of the substrate contacts the peripheral face of the lower roller, the substrate collides near an outer periphery of the peripheral face of the pressing roller, and is inserted between the peripheral face of the lower roller and that of the pressing roller by pushing aside the pressing roller. In this state, the substrate is sandwiched between the lower roller and the pressing roller.

The pressing mechanism provides the pressing roller with a pressing force in order to press the pressing roller to the lower roller, so that the pressing roller presses the substrate toward the lower roller and presses the substrate to the peripheral face of the lower roller.

This substrate also contacts the peripheral face of the upper roller, so that when the substrate contacts the peripheral face of the upper roller and the peripheral face of the lower roller, the substrate remains on the peripheral face of the conveying roller, while it is inclined at the inclination angle θ from the vertical direction. Therefore, the substrate will not slip off from the conveying roller.

The upper rollers, the lower rollers and the pressing rollers are arranged such that when the substrate is placed on the peripheral faces of the conveying rollers while inclined at the inclination angle θ from the vertical direction and moves in that state by the rotation of the conveying rollers, the upper rollers, the lower rollers and the pressing rollers rotate without slipping from the surfaces of the substrate. Thus, the substrate is not scratched and dust is not generated.

When the substrate inclined at the inclination angle θ on the conveying roller moves horizontally in a state such that it is positioned within the same plane, the rollers do not slide with the surfaces of the substrate if the rotary axes of the upper rollers, the lower rollers and the pressing rollers are arranged along a direction vertical to the moving direction of the substrate and also in a direction inclined at the inclination angle θ from the vertical direction.

The extending direction of the rotary axis of the upper roller and the extending direction of the rotary axis of the lower roller are vertical to the extending direction of the rotary axis of the conveying roller.

Since the substrate is conveyed in a posture that is nearly vertical, and not horizontal, the installation space of the vacuum apparatus can be small even if large substrates are to be conveyed. Since the substrate is held sandwiched between the pressing rollers and the lower rollers, it does not fall down from the conveying rollers. Since the substrate does not bump against the lower roller, it is not damaged. The substrate can be conveyed even if a carrier is not used.

DETAILED DESCRIPTION OF THE INVENTION

Figure 8:
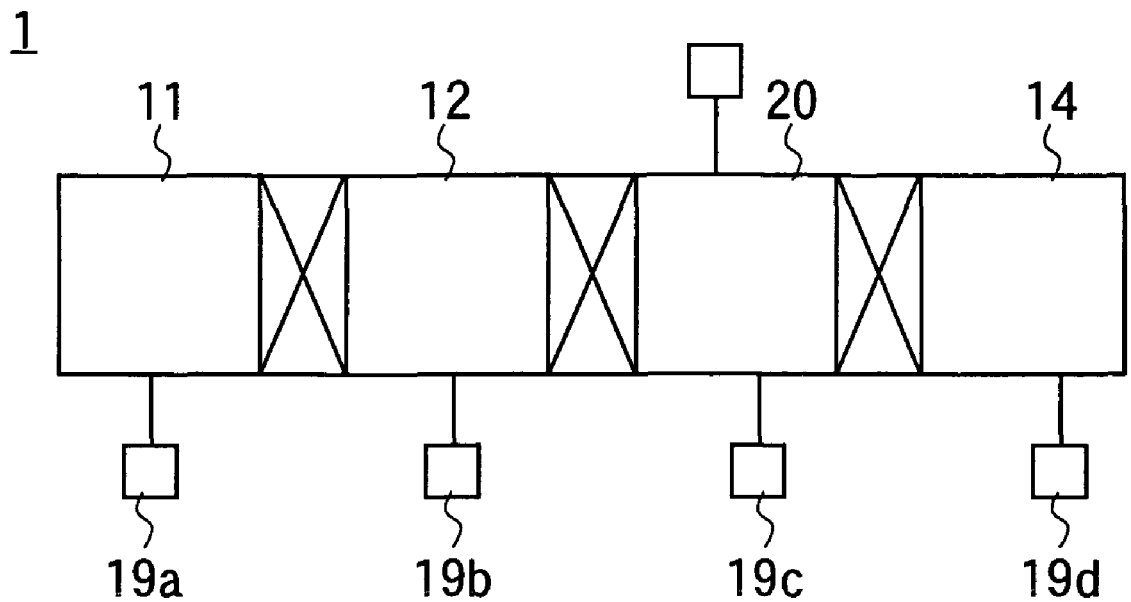
FIG. 8 is a block diagram for illustrating the vacuum apparatus.

FIG. 8 is a block diagram of a vacuum system 1.

The vacuum system 1 comprises a carry-in chamber 11, a heating chamber 12, a vacuum apparatus 20, and a carry-out chamber 14. Vacuum evacuation systems 19a to 19d are configured to be connected to the carry-in chamber 11, the heating chamber 12, the vacuum apparatus 20, and the carry-out chamber 14, respectively, so that they can be discretely evacuated to a vacuum state.

The carry-in chamber 11, the heating chamber 12, the vacuum apparatus 20, and the carry-out chamber 14 are connected in this order, so that the substrate disposed in the carry-in chamber 11 is heated, and processed inside the vacuum apparatus 20, and then carried out from the carry-out chamber 14.

Figure 1:
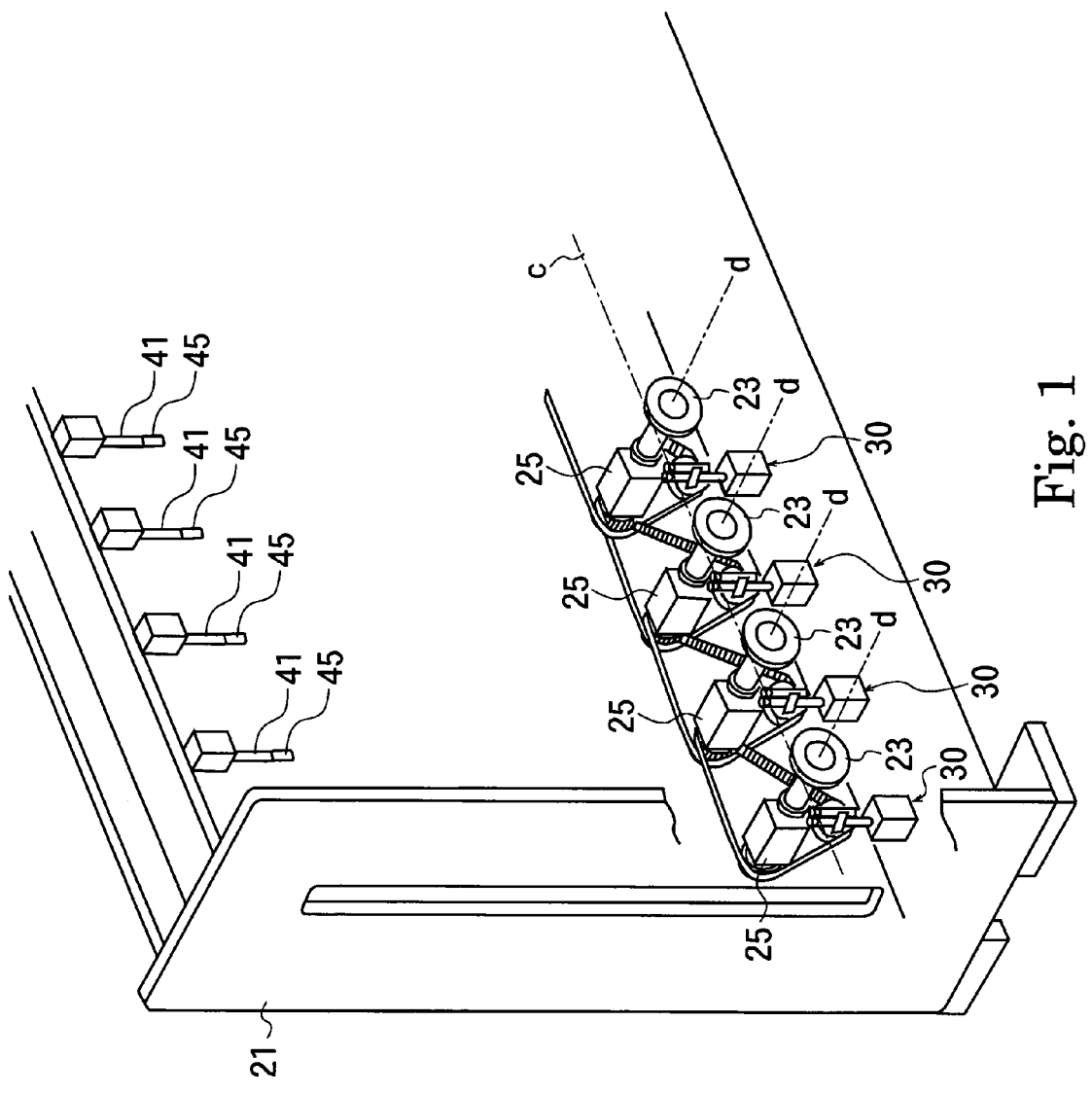
FIG. 1 is a schematic perspective view of the interior for illustrating a vacuum apparatus.

FIG. 1 is a schematic perspective view of the interior for illustrating the vacuum apparatus 20.

This vacuum apparatus 20 comprises a vacuum chamber 21, and a plurality of conveying rollers 23 are arranged on a bottom wall of the vacuum chamber 21, while falling down-preventing devices 30 are arranged between the conveying rollers 23.

Each of rollers including the conveying rollers 23 is of an approximately discoidal shape or an approximately cylindrical shape, and is configured to rotate around a rotary axis passing the center of a bottom face of the disc or the cylinder, while the peripheral face makes a circular motion. Assuming that the cylindrical shape is constituted by two bottom faces and a ring-shape peripheral face connected to outer peripheries of the two bottom faces, the peripheral face of the roller (such as, the conveying roller 23 or the like) refers to a ring-shaped circular peripheral face.

Figure 4A:
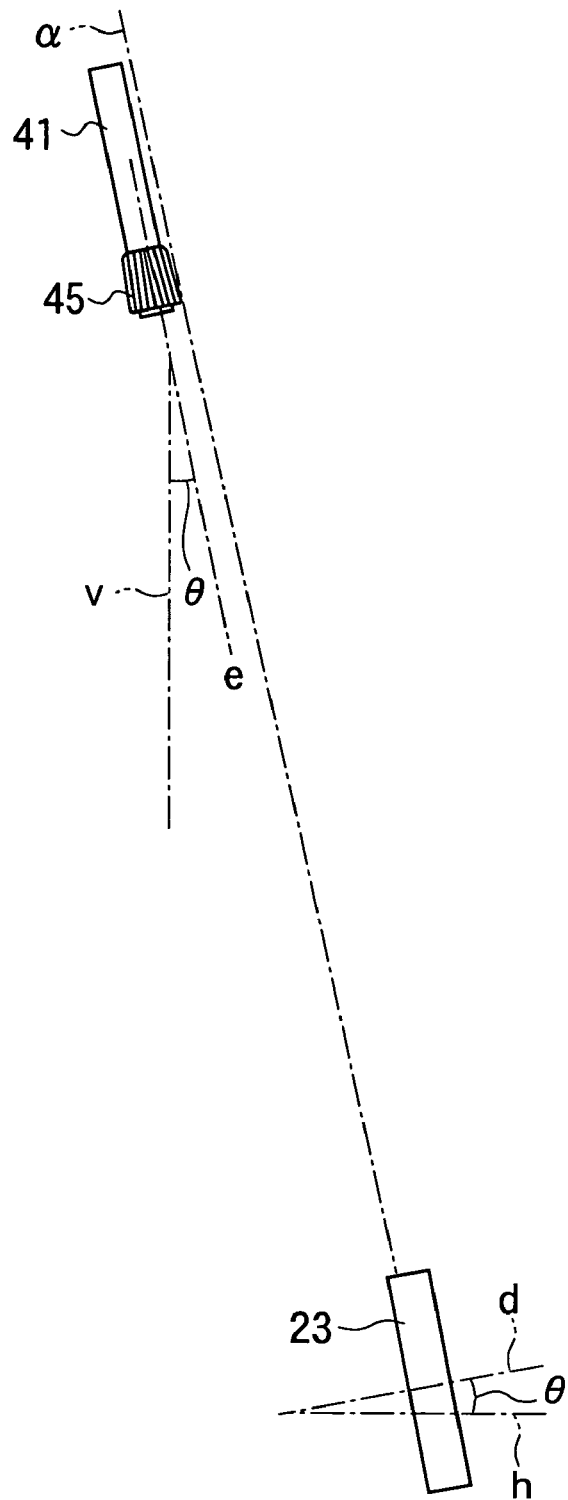
FIGS. 4(a) and (b) are side views for illustrating positional relationships among the conveyer roller, an upper roller and the substrate.
Figure 4B:
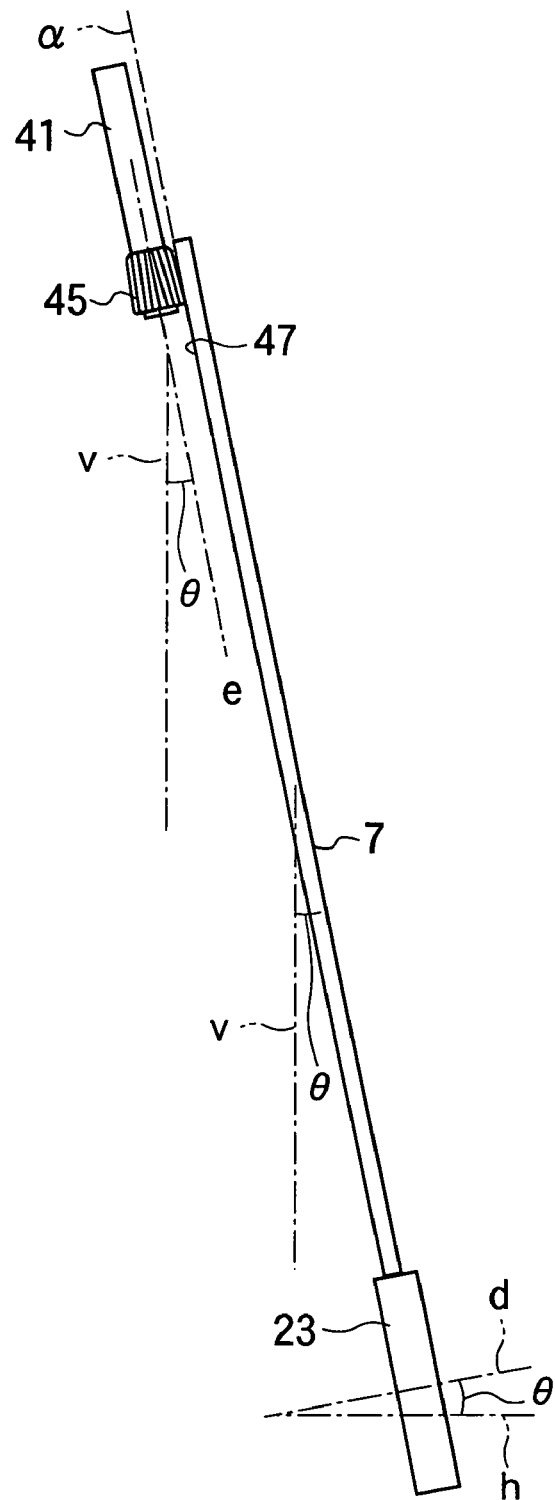

The rotary axes "d" of the respective conveyor rollers 23 are disposed in parallel with one another, while inclined at a predetermined inclination angle θ from a horizontal plane "h" (FIG. 4(*a*)).

The center of each conveying roller 23 is arranged on an identical straight line. Each conveying roller 23 is made of a disk with the same diameter and the same thickness, so that the upper portion of the peripheral face of each conveying roller 23 contacts an identical straight line.

When this straight line is called a conveying straight line, a reference numeral "c" in FIG. 1 denotes this conveying straight line, and the direction of the conveying straight line "c" is orthogonal to a direction in which the rotary axis "d" of each conveying roller 23 extends.

The substrate to be processed in this vacuum apparatus 20 is a quadrangle shape (such as a rectangular shape, a square shape or the like), and surfaces of the substrate are six in total, which include both surfaces of the substrate (front and rear surfaces) as well as four side faces defining the thickness of the substrate.

When the posture of a substrate 7, which is inclined in the same direction as the conveying roller 23 by an inclination angle θ from a vertical axis and is directed to the direction along the conveying straight line, is called a conveying posture, the substrate 7 in the conveying posture can contact the upper end of the conveying roller 23 by aligning it with the conveying straight line with one of the four side faces directed downwardly.

Figure 2:
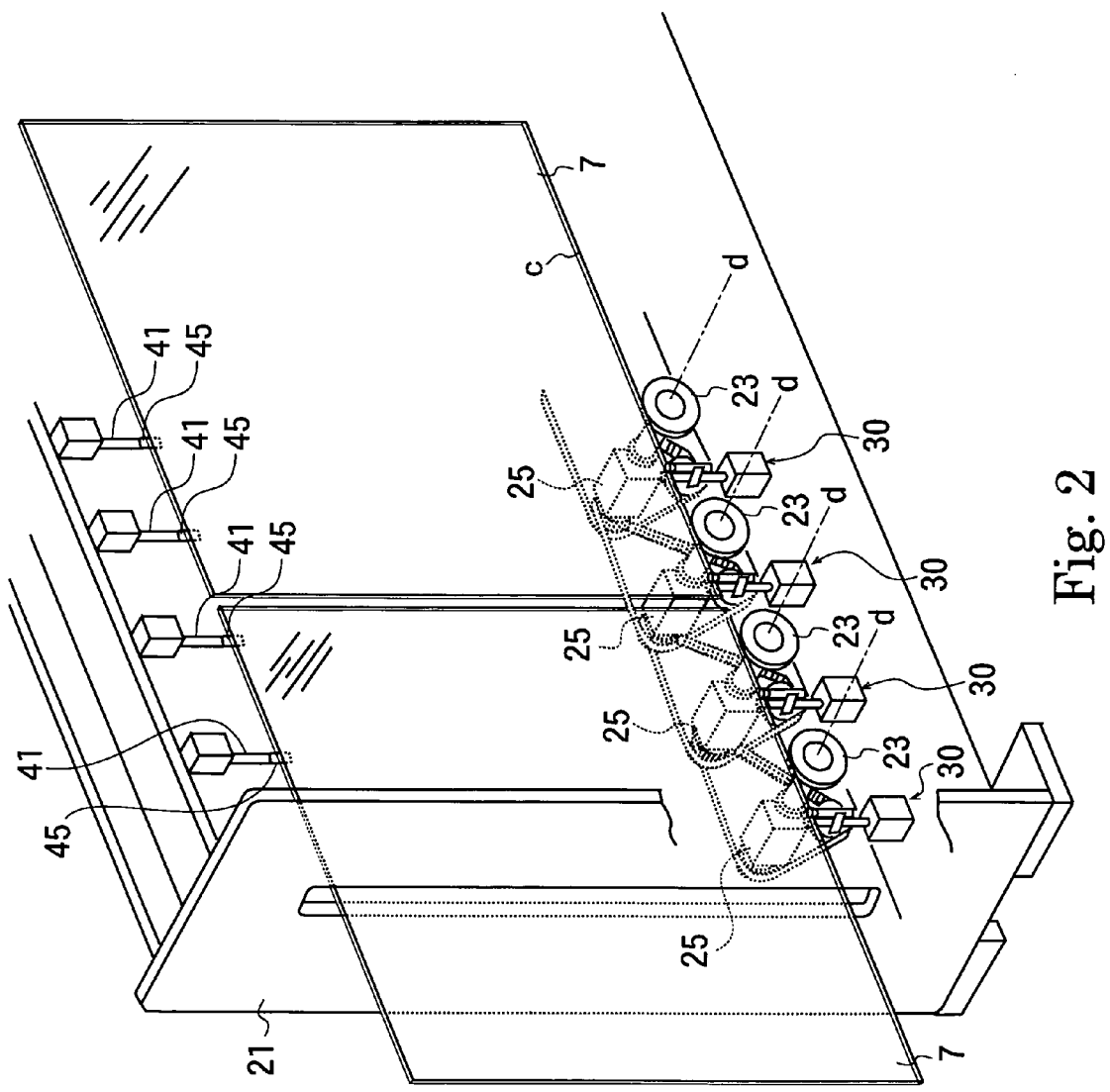
FIG. 2 is a schematic perspective view of the interior for showing a state in which the substrate is placed on conveyer rollers.

FIG. 2 shows a state in which the substrate 7 in the conveying posture is placed on the conveying rollers 23. The conveying roller 23 is configured such that the substrate 7 in the conveying posture does not fall down from on the plurality of conveying rollers 23 due to contact with the peripheral faces of the conveying rollers 23.

Upper main poles 41 are disposed at positions above the conveying rollers 23, while vertically directed. The upper end of the upper main pole 41 is fixed to a ceiling of the vacuum chamber 21; and an upper roller 45 is rotatably fitted to the lower end.

Figure 3:
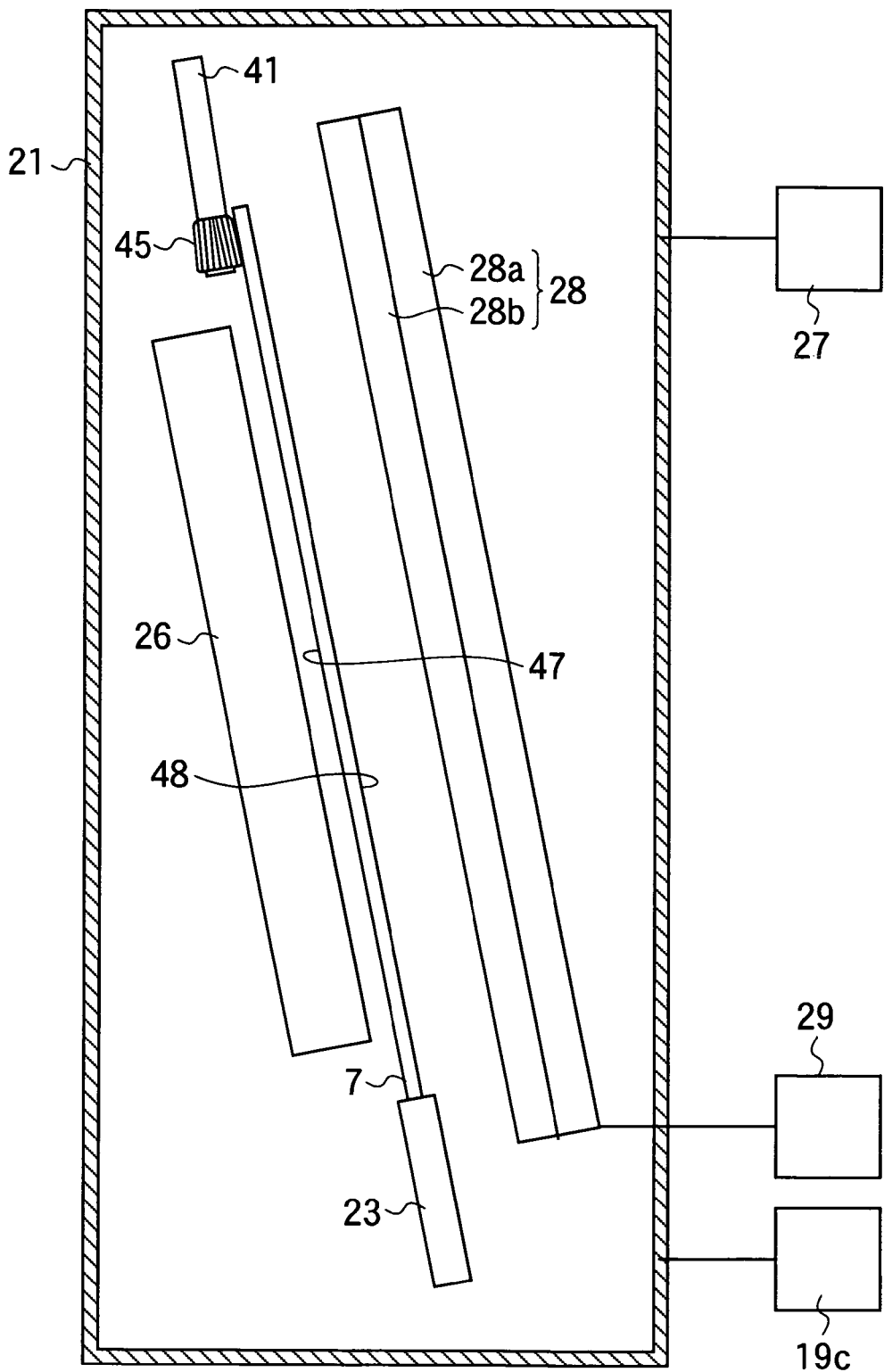
FIG. 3 is a sectional view for showing a state in which the substrate is placed on the conveying roller.

When one of the both surfaces (the two surfaces of the six faces other than the four side faces) of the substrate 7 in the conveying posture, which is directed downwardly (toward the bottom face of the vacuum chamber 21) is taken as a lower surface 47, while the other surface directed upwardly (toward the ceiling of the vacuum chamber) is taken as an upper surface 48, the upper roller 45 is arranged such that the peripheral face contacts near the upper edge of the lower surface 47 of the substrate 7 in the conveying posture on the conveying roller 23 (FIG. 3).

The upper end of the upper main pole 41 is fixed to the vacuum chamber 21. Therefore, as shown in FIG. 3, the substrate 7, which is placed in the conveying posture on the conveying roller 23 and contacts the peripheral face of the upper roller 45, leans the upper rollers 45 so that the substrate may be supported by the upper rollers 45 without falling.

Rotating devices 25 are connected to the conveying rollers 23, and when the conveying rollers are rotated in the same direction in a state such that the substrate 7 in the conveying posture is placed thereon, the substrate 7 is moved in the direction along the conveying straight line "c" (in the direction parallel to the conveying straight line).

In this embodiment, the rotary axis "e" of the upper roller 45 is arranged in order to conform with that of the upper main pole 41 (FIG. 4(*a*)).

In addition, the rotary axis "e" of the upper roller 45 (and that of the upper main pole 41) is inclined from the vertical axis "v" at the same inclination angle θ as the inclination from the horizontal plane "h" of the conveying roller 23, and the direction in which the rotary axis "e" of the upper roller 45 (and the below-mentioned lower roller) extends is vertical to both the direction in which the rotary axis "d" of the conveying roller 23 extends and the direction in which the conveying straight line "c" extends. (The direction of the rotary axis "e" of the upper roller 45 and the lower roller (discussed below), the direction of the rotary axis "d" of the conveying roller 23 and the direction in which the conveying straight line "c" extends are vertical to one another).

When the substrate 7 moves in the conveying posture in the direction along the conveying straight line "c", the lower surface 47 of the substrate 7 moves in a state such that it is located in the same plane.

In FIG. 4(*a*), a reference numeral a denotes a lower flat plane in which a lower surface of the substrate 7 is positioned, and the lower flat plane a intersects the circumferential peripheral face of the conveying roller 23. The upper roller 45 is positioned such that its peripheral face contacts the lower flat plane α. Therefore, when the substrate 7 moves in the conveying posture in the direction along the conveying straight line "c", as shown in FIG. 4(*b*), the lower surface 47 of the surfaces of the substrate 7 contacts the peripheral face of the upper roller 45 so that the upper roller 45 may rotate following the movement of the substrate 7 without sliding.

Meanwhile, a space between the conveying roller 23 and the conveying roller 23, and a space between the upper roller 45 and the upper roller 45 are set such that at least two conveying rollers 23 and at least two upper rollers 45 contact the moving substrate 7 when the substrate 7 moves. Accordingly, the substrate 7 does not fall down between the conveying roller 23 and the conveying roller 23 or toward the rear side of the upper rollers 45.

In this case, the substrate 7 is made of glass; consequently, if the substrate 7 is bent or the moving direction is deviated, the substrate 7 drops off from the conveying rollers 23, and subsequently falls down. In the configuration of the vacuum apparatus 20 of the present invention, falling-down preventing devices 30 are arranged between the conveying roller 23 and the conveying roller 23, thus the substrate 7 on the conveying rollers 23 may not fall down from the conveying rollers 23 due to the falling-down preventing devices 30.

Figure 5:
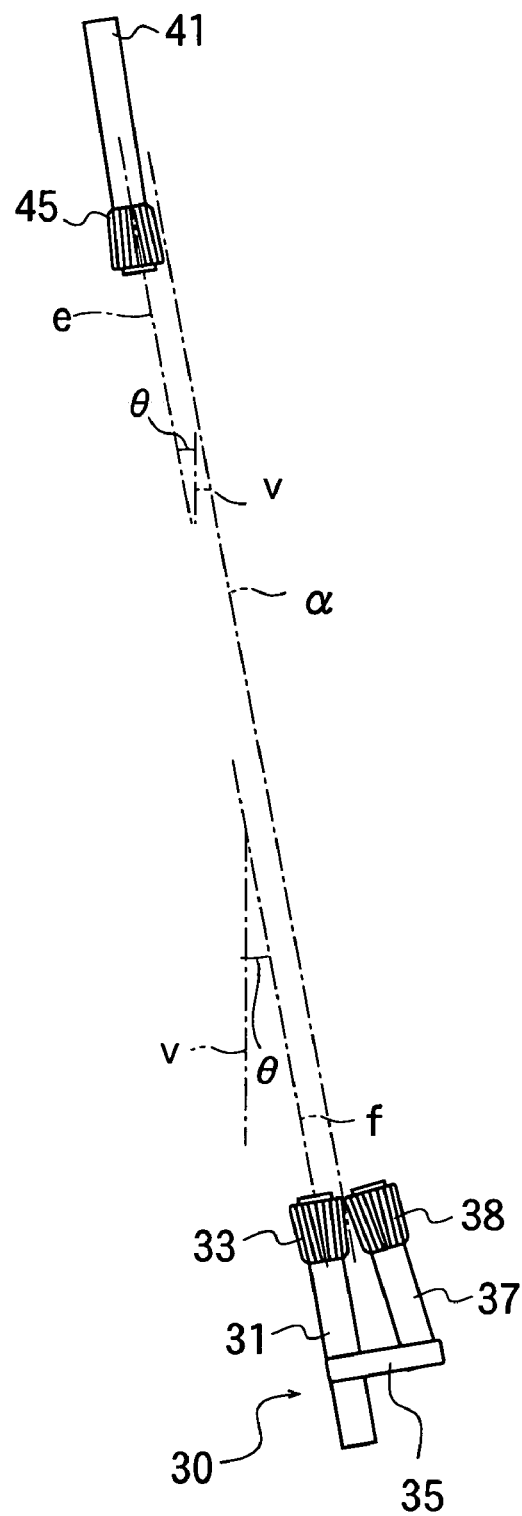
FIG. 5 is a side view for illustrating a positional relation between a falling down-preventing device and the upper roller.

Next, the falling-down preventing device 30 will be explained. As shown in FIG. 5 and FIGS. 6(*a*) and (*b*), the falling-down preventing device 30 comprises a lower main pole 31 and a lower roller 33.

The lower main pole 31 is directed in vertical directions, and a lower end is fixed onto the bottom wall of the vacuum chamber 21, while a lower roller 33 is rotatably provided at an upper end.

The rotary axis "f" of the lower roller 33 is inclined at the inclination angle θ from the vertical axis "v" (the same value as the inclination angle θ from the horizontal line "h" of the conveying roller 23) (FIG. 5).

The lower main pole 31 and the lower roller 33 are arranged on a side of the lower surface 47 of the substrate 7 in the conveying posture. The lower main pole 31 is provided with a support pole 37 via an arm member 35.

The arm member 35 is projected up toward a side of the upper surface 48 facing upward (toward the ceiling) of the substrate 7 on the conveying roller 23 in the conveying posture, and the support pole 37 is erected on its tip, nearly in parallel to the lower main pole 31.

The arm member 35 is positioned below the substrate 7 on the conveying roller 23 so that the arm member 35 and the support pole 37 do not collide with the substrate 7 moving in the conveying posture on the conveying rollers 23.

A pressing roller 38 is rotatably provided at the upper end of the support pole 37.

The arm member 35 is provided with a pressing mechanism 36 (such as, a spring or the like). A force toward a direction in which the lower roller 33 is positioned is applied to the pressing roller 38 by the pressing mechanism.

The lower roller 33 is arranged such that its peripheral face contacts the flat plane (a lower plane α) in which the lower surface 47 of the substrate 7 is located, and the pressing roller 38 is pressed by a force due to the pressing mechanism 36 toward a direction of the portion of the peripheral face of the lower roller 33 which contacts the substrate 7.

Figures 6A, 6B:
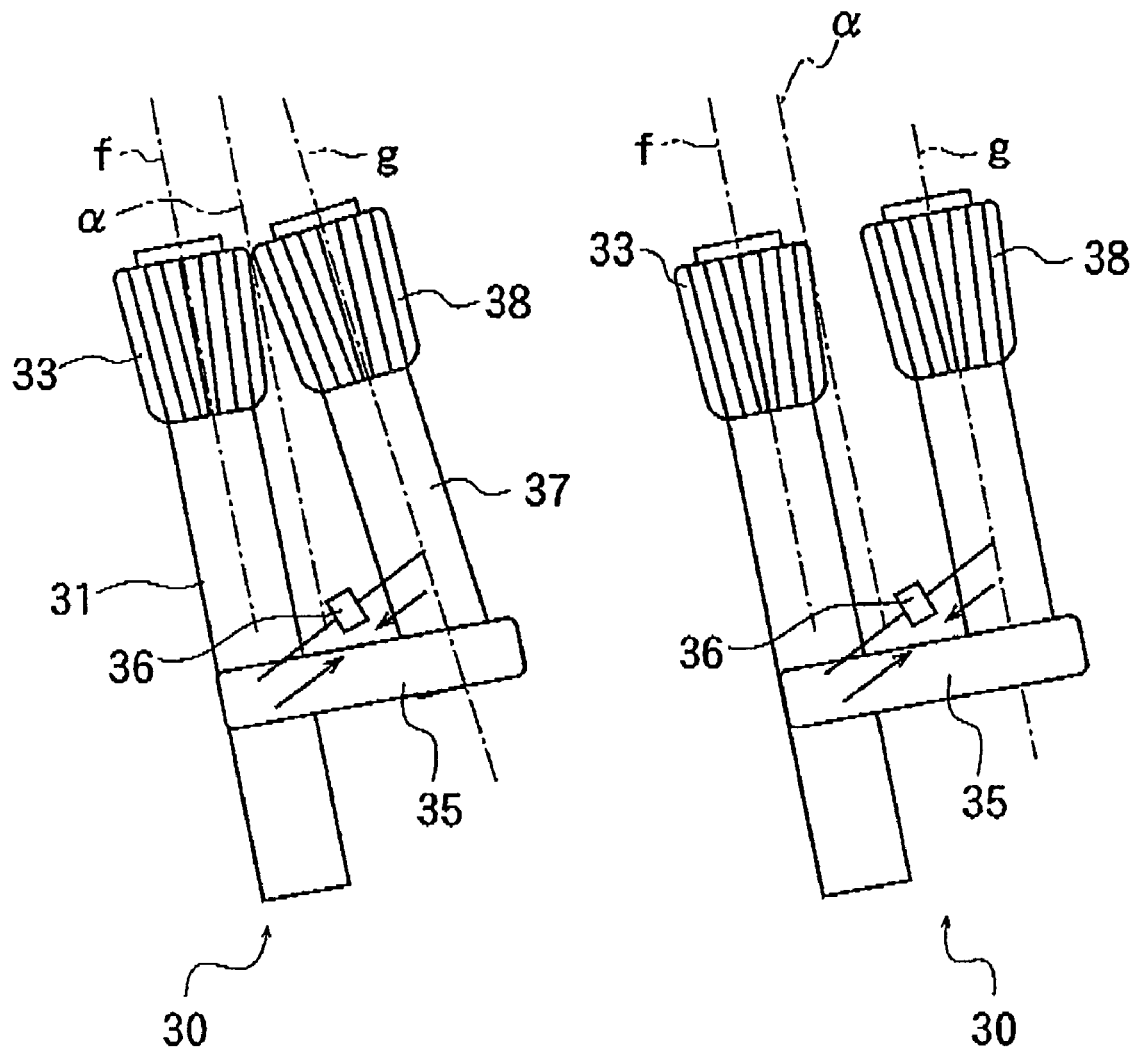
FIGS. 6(a) and (b) are side views for illustrating falling down-preventing devices.

As shown in FIG. 6(a), when the lower roller 33 is not in contact with the substrate 7, the peripheral face of the pressing roller 38 may either be pressed to contact the peripheral face of the lower roller 33 or may be spaced from the peripheral face of the lower roller 33 at an interval narrower than the thickness of the substrate 7.

Figure 7:
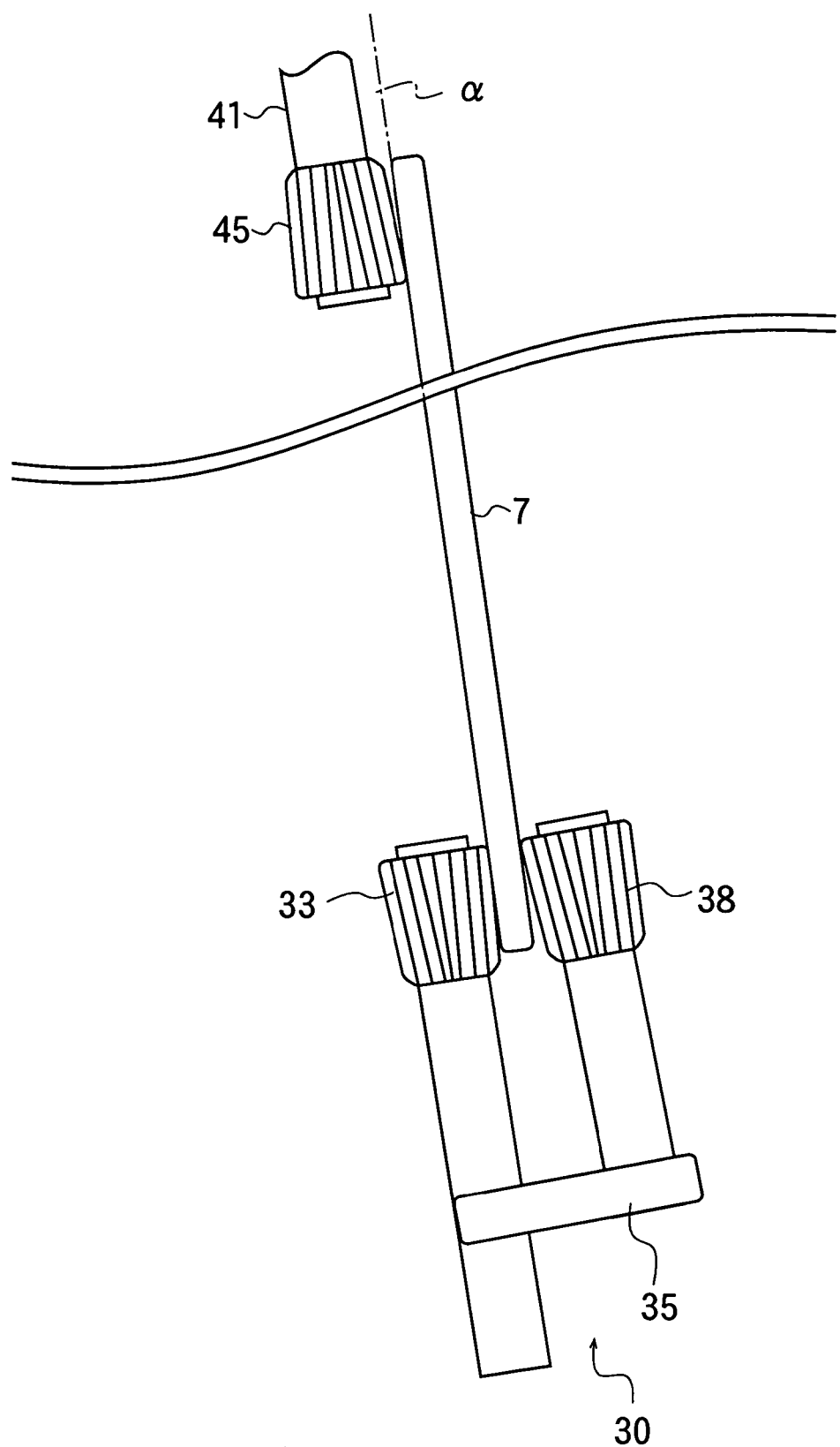
FIG. 7 is an enlarged side view showing a state in which the substrate is positioned by the falling-down preventing device.

When the substrate 7 in the conveying posture on the conveying rollers 23 leaning against the upper rollers 33 moves in the direction along the conveying straight line "c" and approaches the pressing roller 38 pressed against the lower roller 33, a side face of the tip of the substrate 7 first collides with the pressing roller 38, and as the substrate 7 continues to move, it applies a force towards the opposite direction to the force applied from the pressing mechanism 36 to the pressing force 38, while the pressing roller 38 is pushed back by the thickness of the substrate 7 so as to enter the substrate between the pressing roller 38 and the lower roller 33 (FIG. 7)

In this state, the substrate 7 is sandwiched by the lower rollers 33 and the pressing rollers 38; and the lower surface 47 of the substrate 7 contacts the lower rollers 33, while the peripheral faces of the pressing rollers 38 are pressed against the portions of the substrate 7 exactly in reverse of these contacted positions. Therefore, the substrate 7 is pressed to the lower roller 33 by a restoring force by which the pressing roller 38 is to be returned to an original position.

The rotary axis "g" of the pressing roller 38 is in parallel to the rotary axis "f" of the lower roller 33 in a state such that the substrate 7 is sandwiched between the lower roller 33 and the pressing roller 38 (FIG. 6(b)). Therefore, when the substrate 7 riding on the conveying rollers 23 in the conveying posture moves in the direction of the conveying straight line "c", while leaning against the upper rollers 45, the lower rollers 33 and the pressing rollers 38 rotate without sliding, while contacting the lower surface 47 and the upper surface 48 of the substrate 7, respectively. Accordingly, the lower portion of the substrate 7 is kept in contact with the lower rollers 33, so that the substrate 7 is not dropped from the conveying rollers 23.

Respective rollers (conveying, upper, lower and pressing rollers) and pressing mechanisms, as discussed above, are provided inside the heating chamber 12, and the substrate 7 disposed inside the carry-in chamber 11 is moved in the conveying posture into the heating chamber 12.

Figure 10:
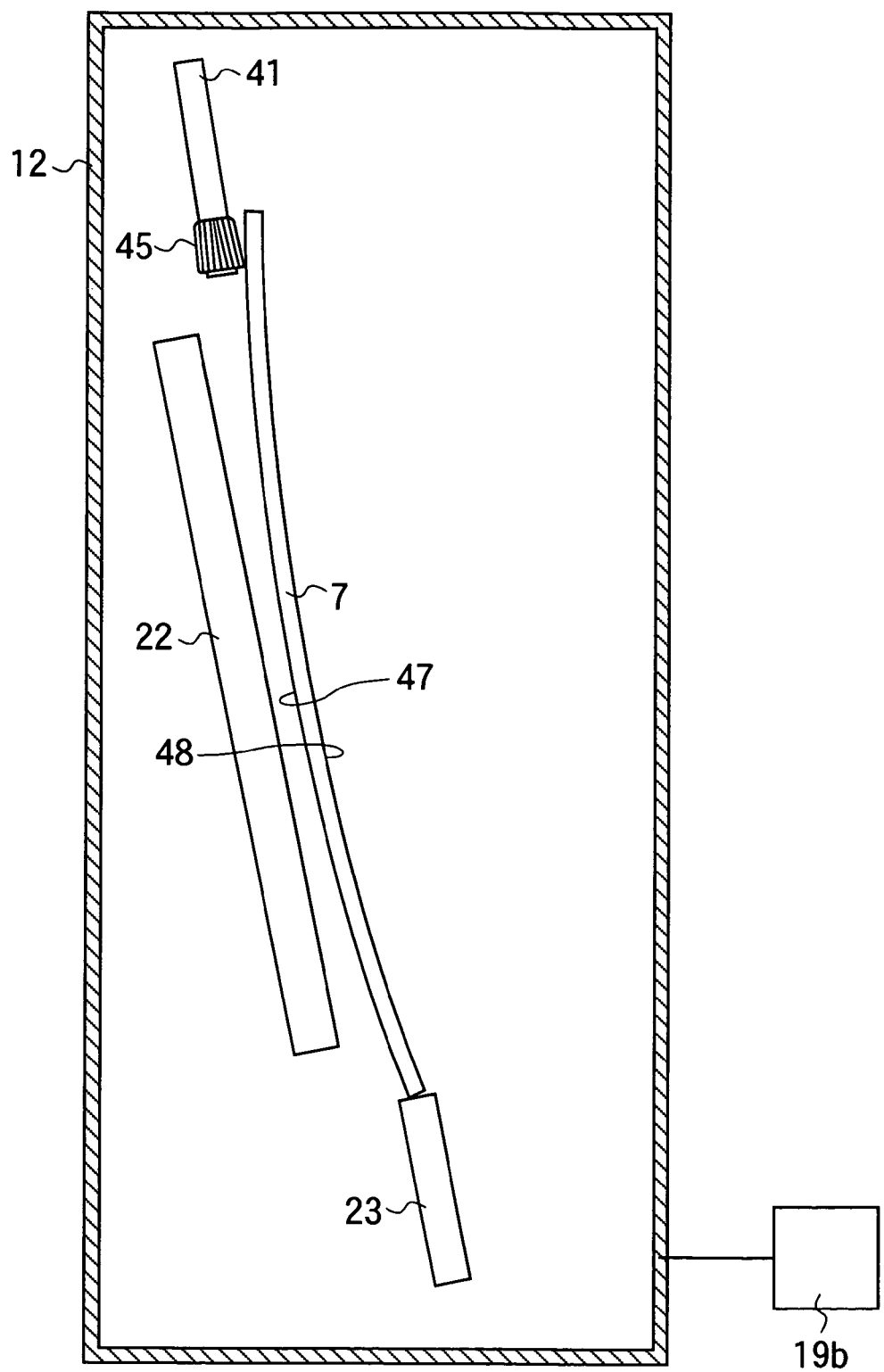
FIG. 10 is a figure for illustrating a manner of curving the substrate.

As shown in FIG. 10, a heater 22 is disposed in the heating chamber 12, and infrared rays are irradiated onto the lower flat surface of the substrate 7 in the conveying posture, so that the substrate 7 riding on the conveying rollers 23 is heated.

By this heating, the lower surface 47 of the substrate 7 is heated at a higher temperature than the upper surface 48, so that the substrate 7 is slightly curved such that the lower surface 47 is convex and the upper surface 48 is concave as a result of the difference in expansion between the surfaces of the substrate 7.

The curved substrate 7 in the conveying posture runs on the conveying rollers 23, and when the tip portion of the substrate 7 as viewed in the moving direction collides with the pressing roller 38 inside the vacuum chamber 21, the pressing roller 38 contacts the upper surface 48 of the tip portion of the substrate 7, while the tip portion does not contact the lower roller 33 because of the curving of the substrate 7. Thus, when the pressing roller 38 is pushed back, an urging force is applied to the pressing roller 38, and the tip portion of the substrate 7 is pressed toward the lower roller 33 by the pressing roller 38, and contacts the lower roller 33 through the removal of the curving.

In this case, the vacuum apparatus 20 is a sputtering apparatus. As shown in FIG. 3, a target 28 is arranged on a side of the upper surface 48 of the substrate 7 carried in the conveying posture into the vacuum chamber 21, and a heater 26 is arranged on a side of the lower surface 47. The target 28 is constituted by disposing a plate-like target material 28b on a backing plate 28a. A film forming face of the substrate 7 is the upper surface 48, and the film forming face is in parallel to a surface of the target material 28b of the target 28.

A gas feeding system 27 is connected to the vacuum chamber 21, and a sputtering power source 29 is connected to the backing plate 28a of the target 28.

The interior of the vacuum chamber 21 is evacuated to vacuum, a sputtering gas (such as, an Ar gas or the like) is introduced from the gas feeding system 27 so as to set the interior of the vacuum chamber 21 to a predetermined pressure, and a voltage is applied to the target 28 by the sputtering power source 29. Accordingly, a plasma is formed near the surface of the target 28, and the surface of the target material 28b is sputtered.

When the substrate 7 is set in the conveying posture and moved by the respective rollers, the rotating devices 25 and the falling down-preventing devices 30, with the film-forming surface kept in parallel to the target 28, a thin film is grown on the film forming surface of the substrate 7.

The substrate 7 is moved, in the conveying state, into the carry-out chamber 14, and taken out to the atmosphere.

Figure 9:
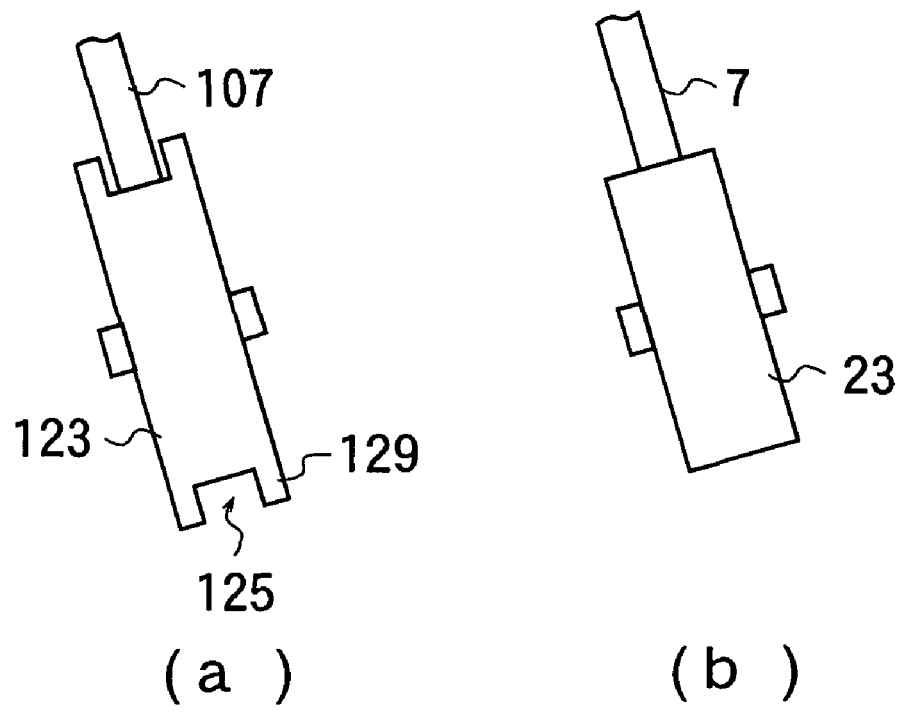
FIG. 9(a) is a sectional view for illustrating a conventional conveying roller.
FIG. 9(b) is a sectional view for illustrating the conveying roller to be used in the present invention.

As explained above, in the vacuum apparatus 20 of the present invention, the substrate 7 on the conveying rollers 23 are held on the conveying rollers 23 by the falling down-preventing devices 30. On the other hand, in the conventional technique, as shown in FIG. 9(a), the substrate 107 is prevented from falling down by forming a recessed groove 125 at a peripheral face of a conveying roller 123 and accommodating it on a bottom face of the recessed groove 125. As shown in FIG. 9(b), according to the present invention, since no recessed groove 125 needs to be formed in the conveying roller 23, there is no fear in the substrate 7 bumping against wall portions 129 of the recessed groove 125.

Meanwhile, the conveying roller 23 of the vacuum apparatus 20 of the present invention can be provided with a recessed groove 125, as shown in FIG. 9(a).

If the relative positional relation of the upper roller 45 to the conveying roller 123 is determined such that the substrate 7 may be placed on the center of the conveying roller 123 in the thickness direction thereof, the substrate is positioned by the falling-down preventing device 30 such that the substrate 7 may not deviate from that position. Consequently, the substrate 7 does not bump against the wall portions 129 of the recessed groove 125.

What is claimed is:

1. A method for conveying a substrate, comprising the steps of:
   arranging a plurality of conveying rollers, which have rotary axes inclined at a predetermined angle from a horizontal plane, along a direction in which a single conveying straight line extends;
   arranging a plurality of upper rollers at positions above the conveying rollers;
   arranging the substrate in a conveying posture in which the substrate is inclined at a predetermined inclination angle from a vertical direction in the state of one side of a lower end of the substrate contacting with peripheral faces of at least two conveying rollers;
   contacting an upper portion of the lower surface directed downwardly of the substrate in the conveying posture with peripheral faces of the upper rollers;
   conveying the substrate in the conveying posture, while the conveying rollers and the upper rollers are rotating,
   arranging a plurality of lower rollers, along the direction in which the conveying straight line extends, at positions in which they can contact a lower portion of the lower surface of the substrate in the conveying posture on the conveying rollers;
   arranging the pressing rollers, with urging forces applied in a direction of the lower rollers, in such positions that the pressing rollers can contact the lower portion of the upper surface of the substrate directed upwardly;
   heating the lower surface of the substrate at a higher temperature than the upper surface of the substrate to slightly curve the substrate such that lower surface is made convex and the surface on the opposite side is made concave in order to collide a side face of the tip of the substrate first with the pressing roller;
   contacting the lower portion of the substrate moving on the conveying rollers with the pressing rollers;
   pressing the lower portion of the upper surface of the substrate with the pressing rollers in directions of the lower rollers when the substrate enters between the lower roller and the pressing roller; and
   moving the substrate, in such a state that the lower end of the substrate is sandwiched by the lower rollers and the pressing rollers.

* * * * *